(12) United States Patent
Eichhorn et al.

(10) Patent No.: US 11,721,934 B2
(45) Date of Patent: Aug. 8, 2023

(54) HIDDEN POWER AND DATA CONNECTORS FOR ACCESSORIES

(71) Applicant: Bayerische Motoren Werke Aktiengesellschaft, Munich (DE)

(72) Inventors: Julian Eichhorn, Menlo Park, CA (US); Brian Mok, Santa Clara, CA (US)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 48 days.

(21) Appl. No.: 17/645,803

(22) Filed: Dec. 23, 2021

(65) Prior Publication Data

US 2023/0208072 A1  Jun. 29, 2023

(51) Int. Cl.
| | |
|---|---|
| *H01R 13/52* | (2006.01) |
| *H01R 13/717* | (2006.01) |
| *H01R 43/26* | (2006.01) |
| *H01R 13/627* | (2006.01) |
| *H01R 13/24* | (2006.01) |
| *H01R 13/22* | (2006.01) |

(52) U.S. Cl.
CPC ..... *H01R 13/5213* (2013.01); *H01R 13/6272* (2013.01); *H01R 13/717* (2013.01); *H01R 43/26* (2013.01); *H01R 13/22* (2013.01); *H01R 13/24* (2013.01)

(58) Field of Classification Search
CPC .... H01R 13/52; H01R 13/717; H01R 13/627; H01R 13/5213; H01R 13/6272; H01R 13/24; H01R 13/22; H01R 13/2414; H01R 43/26; H01R 9/096

USPC .......................................................... 439/37
See application file for complete search history.

(56) References Cited

U.S. PATENT DOCUMENTS

| | | | | |
|---|---|---|---|---|
| 4,940,426 | A * | 7/1990 | Redmond | H01R 13/2414 29/850 |
| 5,184,274 | A * | 2/1993 | Weiss | A61N 1/14 361/220 |
| 6,319,015 | B1 * | 11/2001 | Faunce | H01R 11/22 361/220 |
| 2006/0160383 | A1 * | 7/2006 | Yamada | G01R 1/06755 439/86 |
| 2006/0280322 | A1 * | 12/2006 | Abe | H01R 13/24 381/300 |
| 2009/0072849 | A1 * | 3/2009 | Dickson | G01R 1/07371 324/763.01 |
| 2012/0217988 | A1 * | 8/2012 | Dickson | G01R 1/07371 324/756.05 |
| 2015/0031221 | A1 * | 1/2015 | Sloey | H01R 12/716 439/74 |
| 2017/0060192 | A1 * | 3/2017 | Cousins | H05K 1/028 |
| 2017/0125940 | A1 * | 5/2017 | Karagozler | H01R 13/627 |

(Continued)

FOREIGN PATENT DOCUMENTS

WO  WO 2016/182680 A1  11/2016

*Primary Examiner* — Gary F Paumen
(74) *Attorney, Agent, or Firm* — Crowell & Moring LLP

(57) ABSTRACT

A connector assembly is provided. The connector assembly includes a socket to receive a plug and having an electrical contact. The connector assembly further includes a flexible fabric embedded with a pattern of electrically conductive elements and spanning the socket to conceal the electrical contact. The flexible fabric can deform toward the electrical contact of the socket to cause at least a portion of the pattern to contact the electrical contact.

20 Claims, 25 Drawing Sheets

(56) References Cited

U.S. PATENT DOCUMENTS

| | | |
|---|---|---|
| 2019/0027873 A1 | 1/2019 | Giampi |
| 2019/0209028 A1* | 7/2019 | Baxi ........................ A61B 5/25 |
| 2020/0108768 A1 | 4/2020 | Ali et al. |

* cited by examiner

800

1300

1900

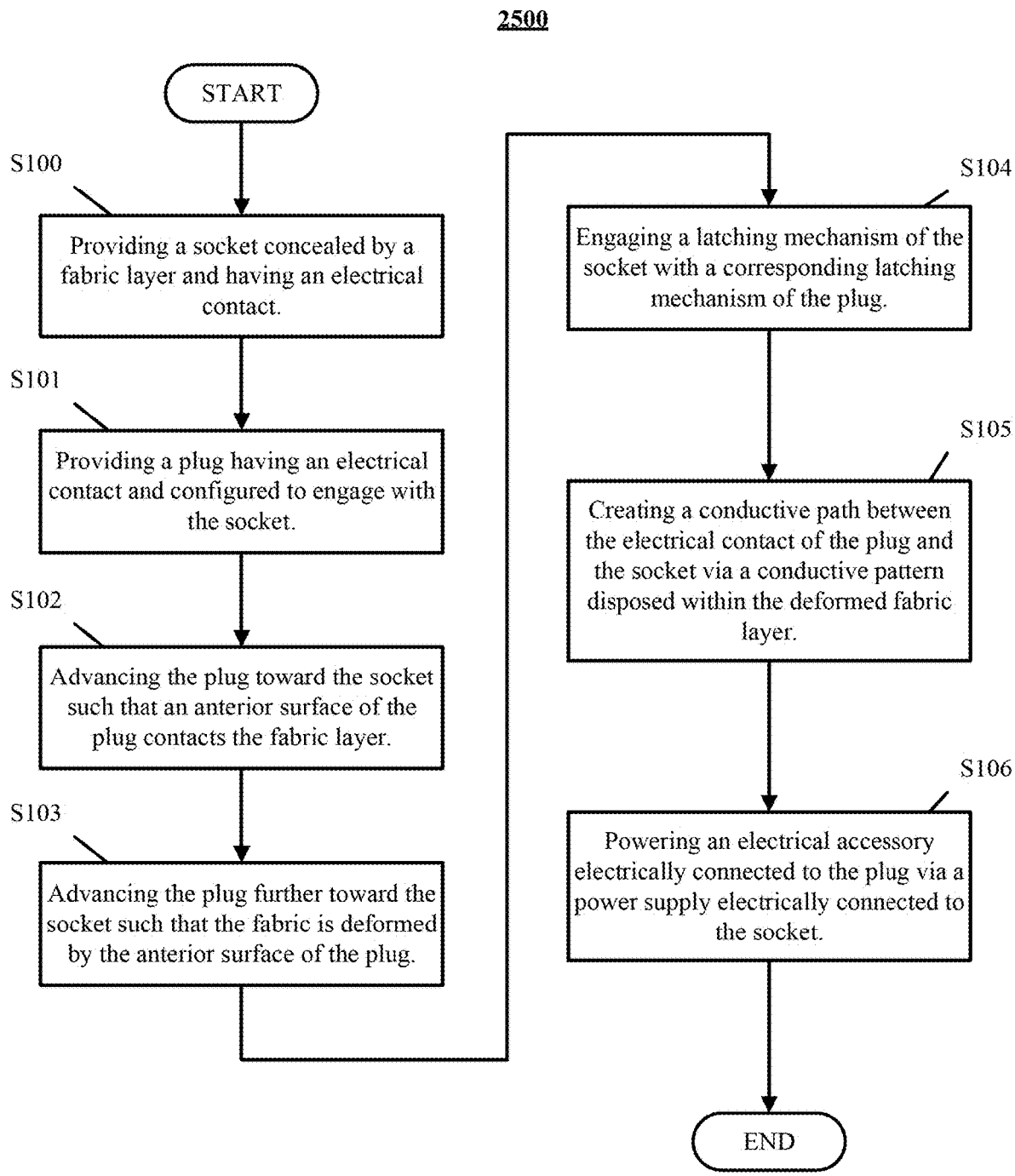

HIDDEN POWER AND DATA CONNECTORS FOR ACCESSORIES

TECHNICAL FIELD

This disclosure relates to power and data connectors and, in particular, to power and data connectors that may be concealed within a vehicle.

BACKGROUND

Present vehicle power and data connectors suffer from a variety of drawbacks, limitations, and disadvantages. Accordingly, there is a need for inventive systems, methods, components, and apparatuses described herein.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

FIG. 25 illustrates a flow diagram of an example of steps to use the connector assembly.

DETAILED DESCRIPTION

Conventional vehicle accessories may utilize a variety of connectors to provide a mechanical, power, and/or data connection. These connectors may not be aesthetically or functionally integrated into the vehicle interior, leading to a cluttered appearance. The connectors may include holes, gaps, slits, and exposed contacts that are prone to collect dust, dirt, and other debris that may degrade the quality, reliability, and appearance of the connectors. The present subject matter aims to resolve the aforementioned disadvantages by providing a connector and socket assembly with a vehicle, which is concealed by a flexible surface. The flexible surface may conveniently hide the connector assembly while preventing the accumulation of dirt and debris therein, thus allowing for a more sanitary and more aesthetically-pleasing appearance.

Figure 1:
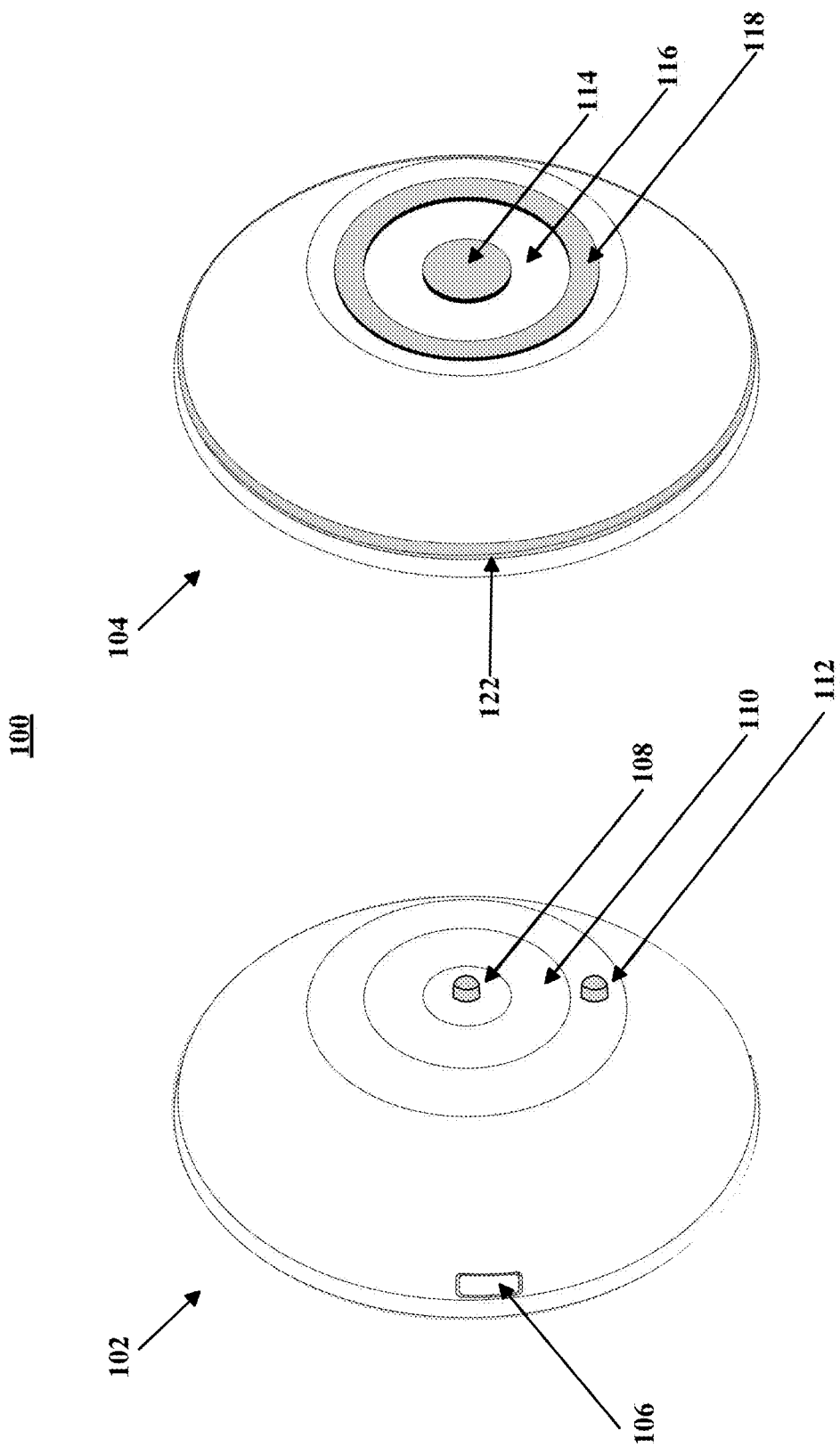
FIG. 1 illustrates a perspective view of an example connector assembly.

FIG. 1 illustrates an example perspective view of a connector assembly 100. The connector assembly 100 may include a plug 102 and a socket 104. The plug 102 may include a latch 106, a central spring-loaded connector pin 108, a ferromagnetic plate 110, a second, radial spring-loaded connector pin 112, and a latch release button 120 (shown in FIG. 2). The socket 104 may include a connector disc 114, a permanent magnet 116, a connector ring 118, and a circumferential groove 122.

The plug 102 and socket 104 may be configured to mate with one another. As an example, the plug 102 may be configured to have a convex, bowl-shaped shape. The socket 104 may also be bowl-shaped, though with a complementary concave shape to receive the plug 102. The corresponding shapes may aid a user in centering the plug 102 within the socket 104 during a process of inserting the plug 102 into the socket 104. Other possible shapes for the plug 102 and socket 104 may be substituted to facilitate alignment of the plug 102 and socket 104 without departing from the scope of the present subject matter. An accessory device may be disposed on the plug 102 or otherwise in direct electrical or mechanical communication with the plug 102, as will be further described with reference to FIGS. 6 through 24.

The physical features of the plug 102 and socket 104 may also be relocated between the plug 102 and socket 104 without departing from the scope of the present subject matter. For instance, the ferromagnetic plate 110 of the plug 102 may be swapped with the permanent magnet 116 of the socket 104. Similarly, one or more of the central spring-loaded connector pin 108 and radial spring-loaded connector pin 112 of the plug 102 may be swapped with one or more of the connector disc 114 and connector ring 118 of the socket 104. Similarly, the one or more latches 106 of the plug 102 and the circumferential groove 122 of the socket 104 may be swapped. In an example, the plug 102 and socket 104 may be approximately three inches in diameter. The ferromagnetic plate 110 of the plug 102 may be attracted to the permanent magnet 116 of the socket 104 to further aid in aligning the plug 102 and socket 104 during the insertion process by a user. The ferromagnetic plate 110 may be any ferrous metal, such as steel, iron, or even another permanent magnet disposed with its poles oriented such that the permanent magnet causes an attractive force to be exerted on the permanent magnet 116 of the socket 104.

Upon receiving the plug 102 into the socket 104 during the insertion process, the central spring-loaded connector pin 108 of the plug 102 may be disposed in contact with the connector disc 114. Similarly, the radial spring-loaded connector pin 112 may be disposed in contact with the connector ring 118. The spring-loaded connector pins 108/112 may be configured to deliver power and/or data through powerline communication. The spring-loaded functionality of the connector pins 108/112 may aid the stability of electrical connection when subjected to shocks and vibration that cause minor shifts and/or displacements of the plug 102 and socket 104 relative to one another. The spring-loaded functionality of the connector pins 108/112 may also aid the stability of the electrical connection despite variations in the manufacturing tolerances of the plug 102 and socket 104 and despite variations in a thickness of an intervening flexible surface, as will be further discussed. The connector ring 118 of the socket 104 may form a continuous ring that allows the plug 102 to complete the electrical connection with the socket 104 while being inserted in any circumferential orientation. The central spring-loaded connector pin 108 and the radial spring-loaded connector pin 108/112 may be formed from other types of electrical contacts without departing from the scope of the present subject matter, such as a conductive leaf spring connector, a conductive rubber contact that contains conductive particles, such as graphite or metal, or a wire brush connector. One or more of the central spring-loaded connector pin 108 and the radial spring-loaded connector pin may also be formed in alternative shapes without departing from the scope of the present subject matter. For instance, the central spring-loaded connector pin 108 may be rectangular, cylindrical, pyramidal, conical, hemispherical, or tubular in shape.

The connector disc 114 and connector ring 118 of the socket 104 may be further electrically connected to one or more power supplies (not illustrated) of a vehicle. The power supply may provide any appreciable voltage depending on the requirements of accessories anticipated to be used in the socket 104. For instance, the connector disc 114 and connector ring 118 may be connected to one or more of a ground potential (0 volts (V)), +5V direct current (DC), +12 VDC, +24 VDC, or even alternating current (AC) power sources, such as 110 VAC, 220 VAC, and the like. Alternatively, or in addition, the connector disc 114 and connector ring 118 may not be connected to any power supply of the vehicle at all. Such may be the case when the socket 104 is designated for connecting strictly mechanical accessories, such as a cupholder, a table, a mirror, and/or the like.

Each component may include additional, different, or fewer components. For example, the plug 102 may include one or more latches 106. The one or more latches 106 may be configured to mate with the circumferential groove 122 of the socket 104 to retain the plug 102 thereon. Collectively, the one or more latches 106 of the plug 102 and the circumferential groove 122 of the socket 104 may be understood as a latch assembly. Preferably, at least three latches 106 are disposed on the plug 102 to resist wobbling of the plug 102 within when disposed within the socket 104. The one or more latches 106 may be spring loaded to engage the circumferential groove 122 upon contacting it during the insertion process. Alternatively, or in addition, the latch assembly may be formed from a twist-type latch that provides retention upon twisting the plug within the socket 104.

Figure 2:
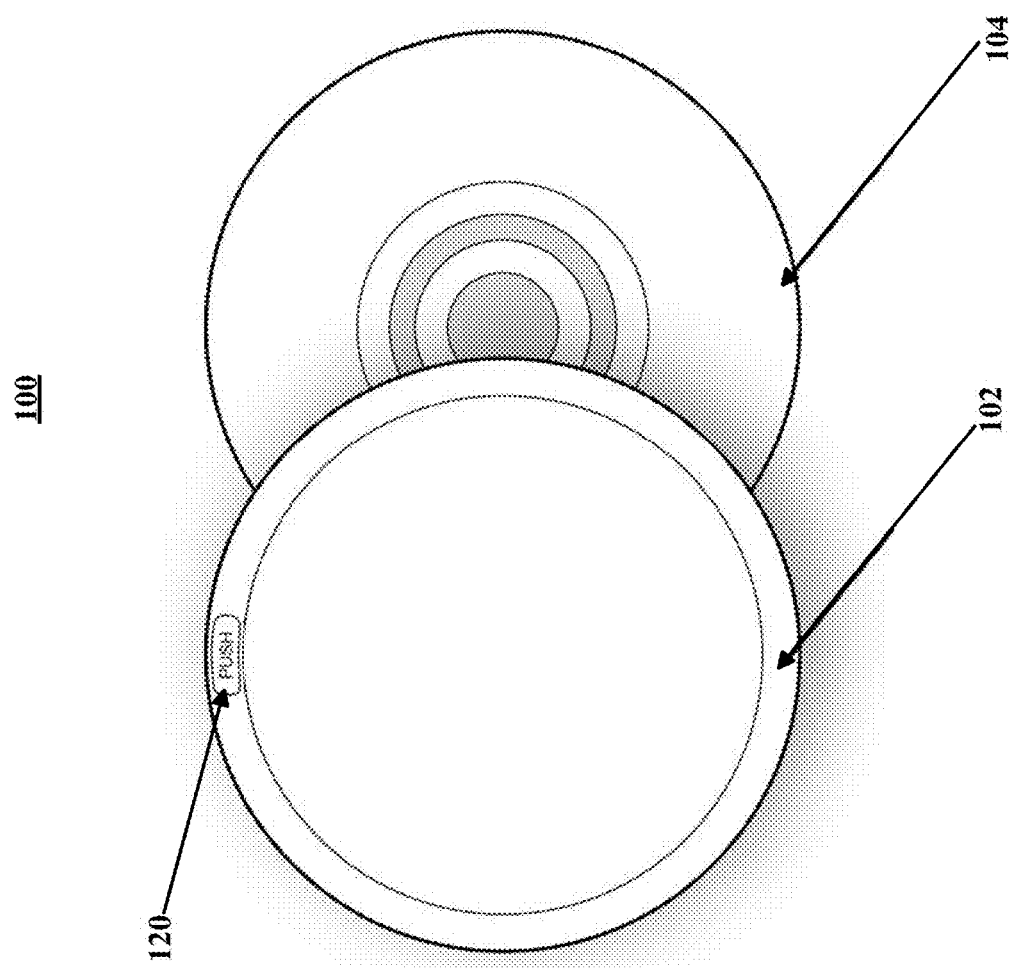
FIG. 2 illustrates an orthographic view of an example connector assembly.

FIG. 2 shows an alternate orthographic view of the example connector assembly 100. In the view of FIG. 2, the latch release button 120 can be seen, which may release the one or more latches 106 of the plug 102 from the circumferential groove 122 of the socket 104. The latch release button 120 may be embossed or otherwise labeled with an instruction directed at the user, such as "PUSH," as shown in FIG. 2. Upon depressing the latch release button 120, the user may remove the plug 102 from the socket 104 by pulling with a force sufficient to overcome the force of the permanent magnetic 116 on the ferromagnetic plate 110.

Figure 3:
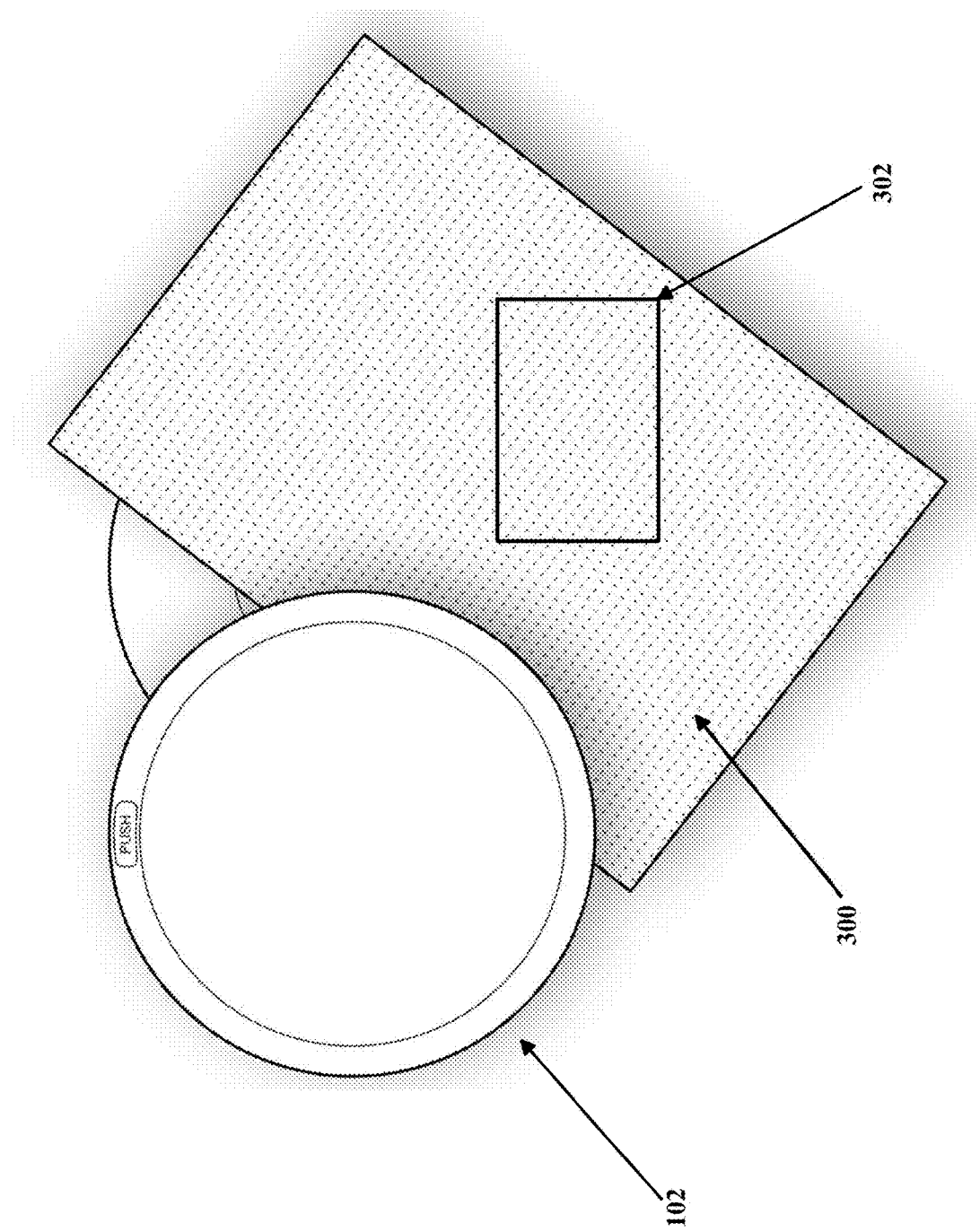
FIG. 3 illustrates an example orthographic view of an example socket concealed by a flexible fabric.

FIG. 3 shows an example orthographic view demonstrating how the socket 104 may be concealed by a flexible fabric 300. By example, the flexible fabric 300 may be made from one or more of spandex, vinyl, Jersey cotton, rubber, and the like, alone or combined in varying proportions. As previously discussed, the socket 104 may be formed in a concave bowl shape; however, prior to the socket 104 receiving the plug 102, the flexible fabric 300 may span the concave bowl shape of the socket 104 in a planar fashion such that the underlying socket 104 appears concealed. The flexible fabric 300 may be imprinted or embedded with a conductive pattern 302, such as a series of dots as shown in FIG. 3. The conductive pattern 302 may be a repeating, uniform, pattern disposed throughout the flexible fabric 300, which may form at least a portion of an upholstery fabric of the vehicle. Alternatively, or in addition, the conductive pattern 302 may be present only in an area proximate to the socket 104; more specifically, to match an area of the socket 104, for example. Alternatively, or in addition, the conductive pattern 302 may be multicolored and/or non-uniform to form an icon or image that identifies the location of the socket 104. The conductive pattern 302, or in an example, each dot, may be capable of conducting electricity through the flexible fabric 300 in a cross-direction. That is, the conductive pattern 302 may be capable of conducting power and data from one side of the flexible fabric 300 through to the other side of the flexible fabric 300 in a direction perpendicular to an imaginary plane in which the fabric is disposed. By example, the conductive pattern 302 may be implemented using a conductive ink, although other techniques are possible, such as using conductive threads stitched into a pattern, conductive fasteners such as rivets, sequins, conductive balls, and/or the like stitched or otherwise joined to the flexible fabric 300. Prior to receiving the plug 102, the conductive pattern 302 of the flexible fabric 300 may or may not partially contact the connector disc 114 and/or the connector ring 118.

To ensure that the spring-loaded connector pins 108/112 contact at least one dot of the conductive pattern 302, the spacing between adjacent dots may be made less than a diameter of each of the spring-loaded connector pins 108/112. Where the spring-loaded connector pins 108/112 are configured of differing shapes, the spacing between adjacent dots may be made less than a smallest dimension of the pin(s) 108/112 that contacts the flexible fabric 300 during the insertion process. Given this constraint, the distance on the plug 102 between the central spring-loaded connector pin 108 and the radial spring-loaded connector pin 112 may be made larger than the diameter of each of the spring-loaded connector pins 108/112 to ensure electrical isolation between the spring-loaded connector pins 108/112. Similarly, the distance on the socket 104 between the connector disc 114 and the connector ring 118 may be made to correspond to the distance between the central spring-loaded connector pin 108 and the radial spring-loaded connector pin 112, which may be at greater than or equal to the diameter of one or more of the spring-loaded connector pins 108/112 of the plug 102.

It should be appreciated that as the flexible fabric 300 flexes and/or expands and contracts with temperature, the spacing between adjacent dots may vary. Where the socket 104 is concealed by a flexible fabric 300, the insertion process of the plug 102 into the socket 104 may stretch the flexible fabric 300 from the moment that the plug 102 is applied to the flexible fabric 300. The flexible fabric 300 may continue to stretch until the plug 102 becomes seated and latched via latch 106 into the socket 104. Compression of the flexible fabric 300 may cause the spacing between adjacent dots to become reduced while stretching of the flexible fabric 300 may cause the spacing between adjacent dots to increase. Therefore, the spacing between adjacent dots may be preferably made as small as possible in consideration of a maximum compression of the flexible fabric 300 to avoid a scenario where electrical isolation between the spring-loaded connector pins 108/112 is lost, and a conductive path is formed by adjacent dots. At the same time, the dots may preferably be spaced closely such that a maximum stretch of the flexible fabric 300 does not cause the spacing between dots to become so large that either of the spring-loaded connector pins 108/112 miss contacting any of the dots of the conductive pattern 302. Similar considerations may be necessary where the conductive pattern 302 is achieved using a different conductive pattern 302 that does not utilize dots, for example.

Figure 4:
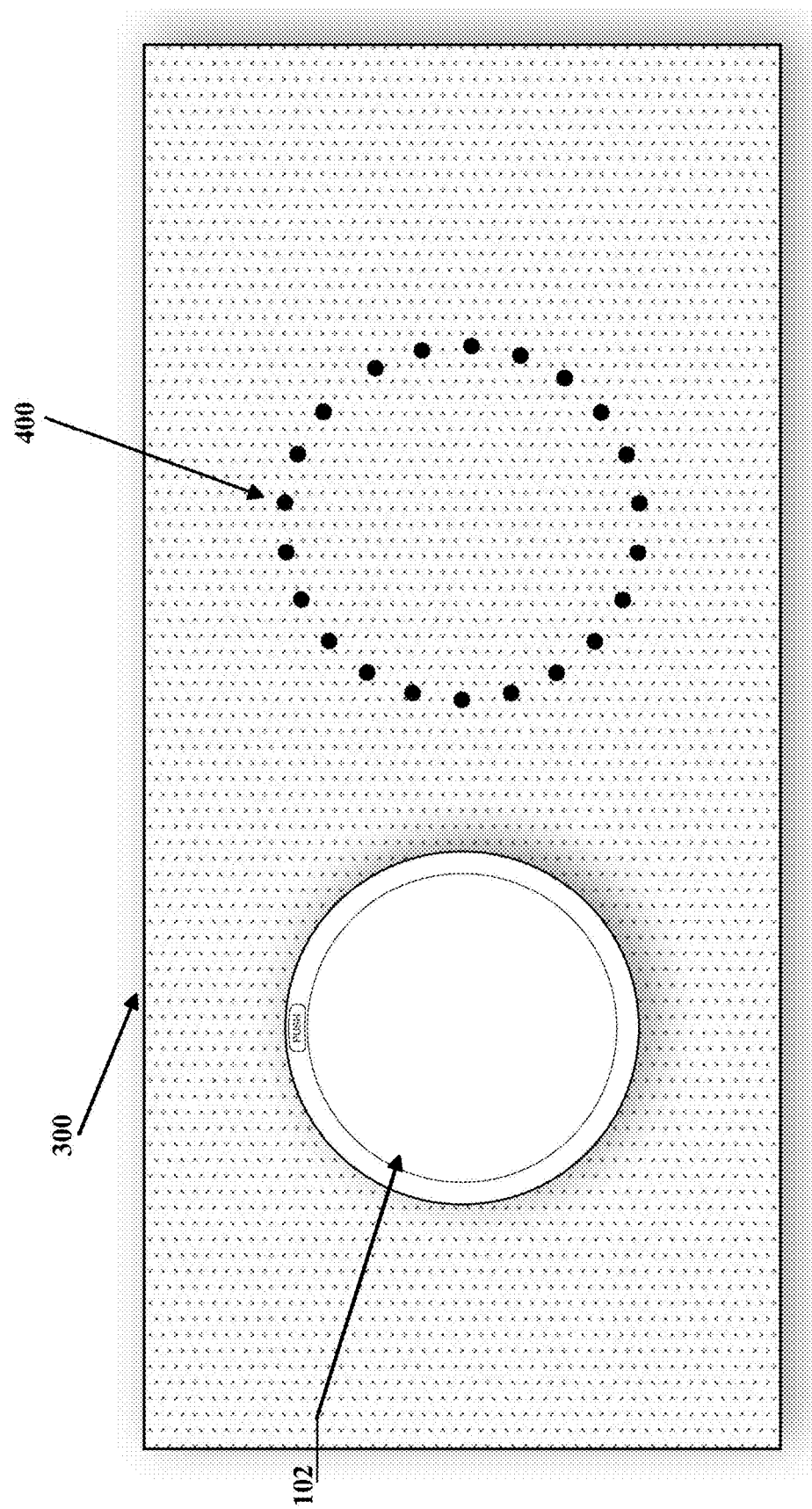
FIG. 4 illustrates an example of highlighting an example concealed socket.

FIG. 4 illustrates an example of highlighting a concealed socket 104 using a graphical ring 400. In a vehicle, the socket 104 may be disposed behind the flexible fabric 300 to conceal the location of the underlying socket 104, which may improve the aesthetic appearance of the vehicle interior. The flexible fabric 300 may be part of the vehicle upholstery that covers a portion of the vehicle interior, such as a door panel, dashboard panel, seat, headliner panel, console, armrest, floor pan, a-pillar, b-pillar, and/or the like. The underlying socket 104 may be located by the user by highlighting the socket 104 in a variety of ways. For instance, one or more light sources (not shown) may be disposed to illuminate the area in which the underlying socket 104 is disposed, either projected onto the exposed side of the flexible fabric 300 or transmitted from beneath the flexible fabric 300. Alternatively, or in addition, the presence of the conductive pattern 302 may highlight the position of the underlying socket 104. Alternatively, or in addition, colored textual labels and/or graphics, such as the ring 400 shown in FIG. 4, may be disposed proximate to the underlying socket 104. Alternatively, or in addition, a vacuum source (not illustrated) may be selectively applied to deform the flexible fabric 300 into the socket 104, to reveal the concave shape of the socket 104 within the flexible fabric 300. Alternatively, or in addition, a light source highlighting the concealed socket 104 may utilize color to indicate whether the socket is available/unavailable to be used, the type of power delivered by the socket, and/or a type of compatible accessory.

Figure 5:
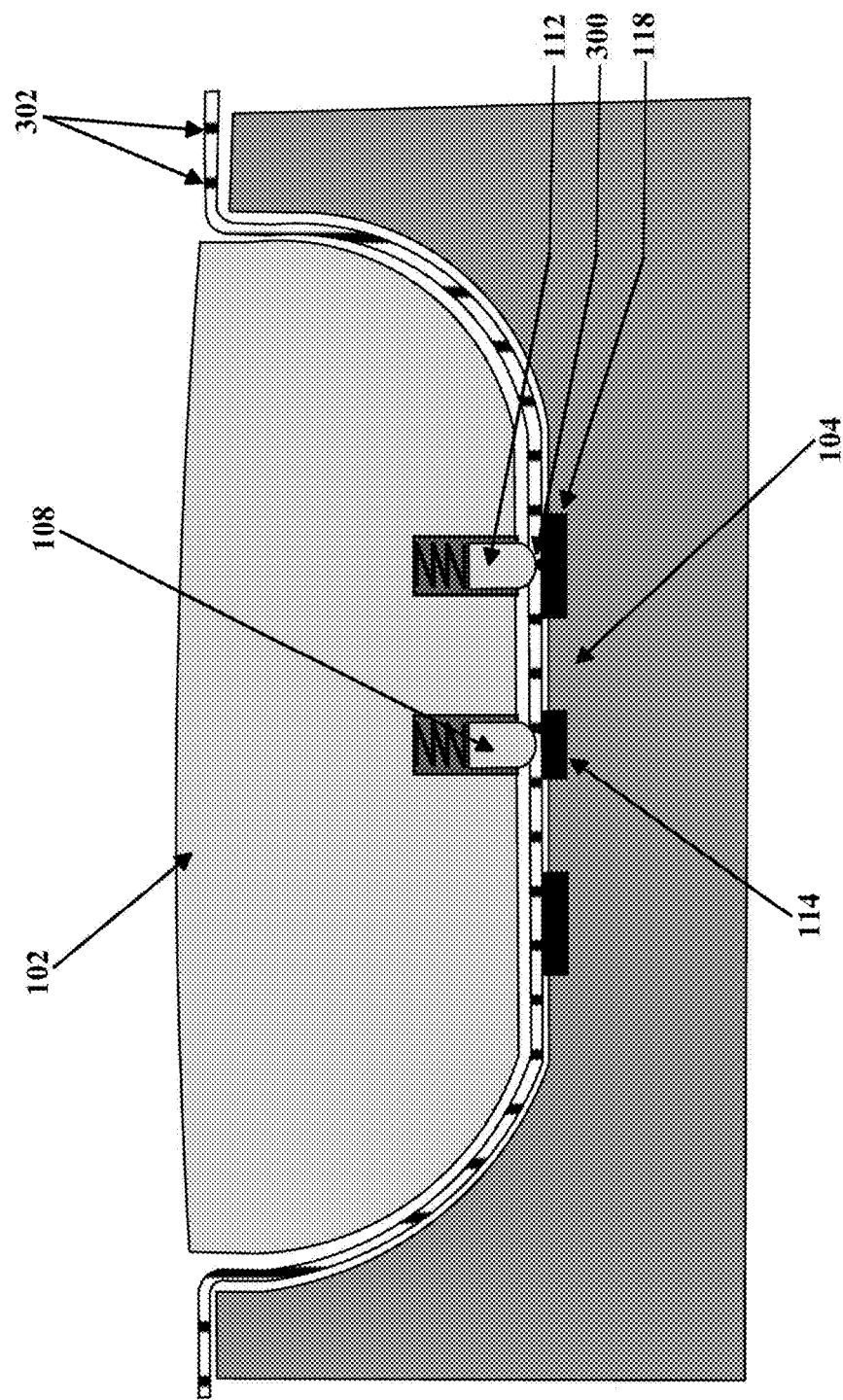
FIG. 5 illustrates a cross-sectional view of example connector assembly.

FIG. 5 is a cross-sectional view of the plug 102 seated within the socket 104 concealed by a flexible fabric 300 having a conductive pattern 302 as illustrated by the stripes of the flexible fabric 300, for example. As shown when inserted, the plug 102 may stretch and distort the flexible fabric 300 such that the flexible fabric 300 substantially follows the shape of the plug 102 and/or socket 104. More specifically, during the insertion process of the plug 102 into the socket 104, the flexible fabric 300 may be deformed such that it substantially conforms to an anterior surface of the plug 102. By anterior surface, it should be understood the surface of the plug 102 that is closest to the socket 104 when advancing the plug 102 toward the socket 104 in the correct direction. Once inserted into the socket 104, the central spring-loaded connector pin 108 may contact one or more dots/stripes of the conductive pattern 302 and subsequently make electrical contact with the connector disc 114. Similarly, the radial spring-loaded connector pin 112 may contact one or more dots/stripes of the conductive pattern 302 to make electrical contact with the connector ring 118. Stated another way, the insertion of the plug 102 into the socket 104 sandwiches the flexible fabric 300 to form a conductive path between the connector pins 108/112 of the plug 102 with the connector disc 114 and connector ring 118 of the socket 104 via the conductive pattern 302. Following unlatching and removal of the plug 102 from the socket 104, the flexible fabric 300 may resiliently return to its previous planar shape.

Figure 6:
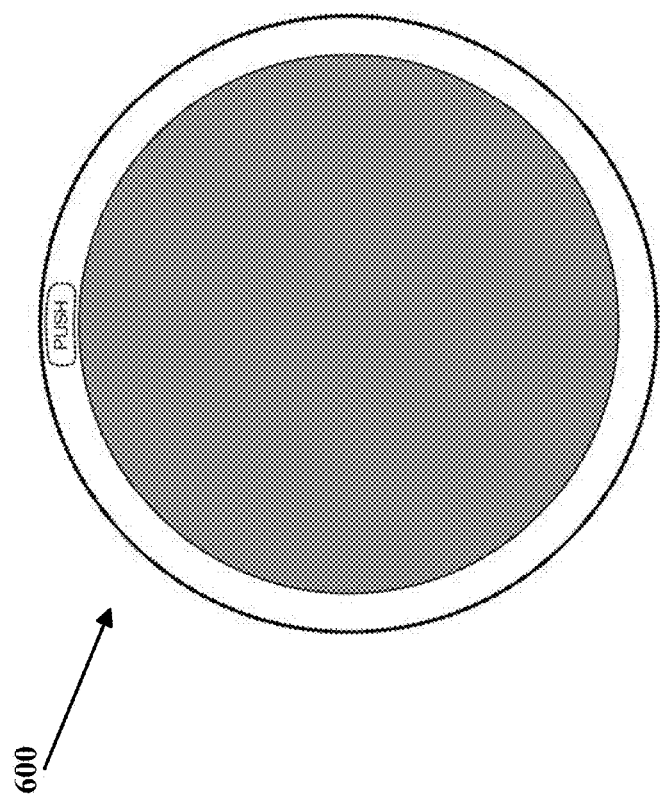
FIG. 6 illustrates an example accessory device.

FIG. 6 illustrates an example accessory in the form of an audio speaker 600, which may be coupled to the plug 102 to engage with the socket 104. The audio speaker 600 may be powered via connector disc 114 and connector ring 118 and receive audio data wirelessly or in using powerline communication that occurs via connector disc 14 and connector ring 118.

Figure 7:
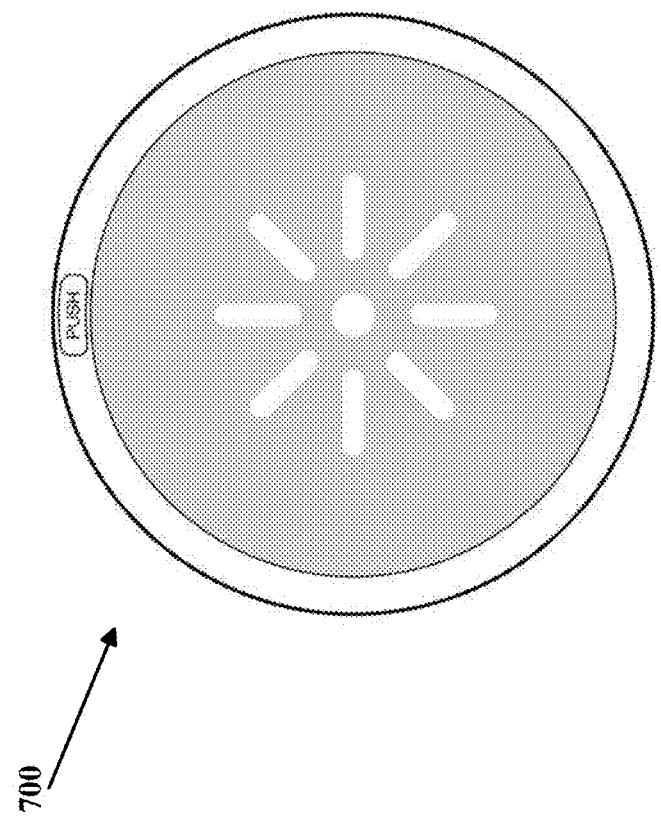
FIG. 7 illustrates an example accessory device.

FIG. 7 illustrates an example accessory in the form of a lamp 700, which may be coupled to the plug 102 to engage with the socket 104. The lamp 700 may be powered via connector disc 114 and connector ring 118 and transmit and receive data to vary one or more parameters of the lamp 700 wirelessly or in using powerline communication that occurs via connector disc 114 and connector ring 118.

Figure 8:
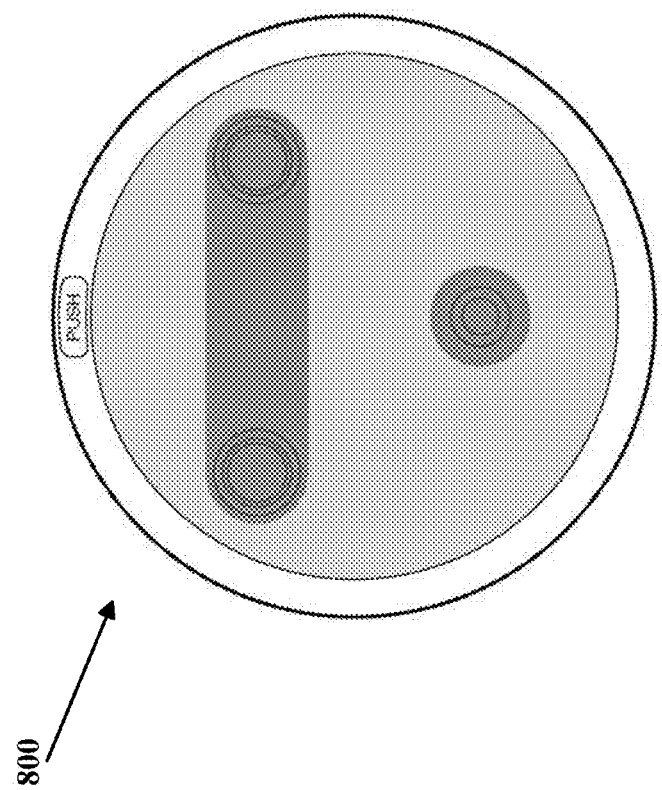
FIG. 8 illustrates an example accessory device.

FIG. 8 illustrates an example accessory in the form of a projection mapping system 800, which may be coupled to the plug 102 to engage with the socket 104. The projection mapping system 800 may be powered via connector disc 114 and connector ring 118 and may transmit and receive data wirelessly or by using powerline communication that occurs via connector disc 114 and connector ring 118.

Figure 9:
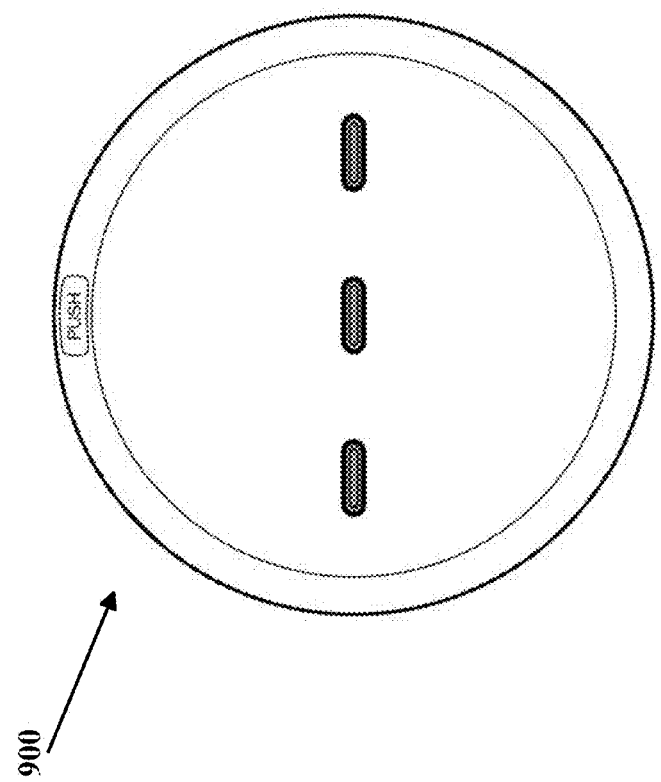
FIG. 9 illustrates an example accessory device.

FIG. 9 illustrates an example accessory in the form of a USB-C socket 900, which may be coupled to the plug 102 to engage with the socket 104. The USB-C socket 900 may be powered via connector disc 114 and connector ring 118 and send and receive data using powerline communication that occurs via connector disc 114 and connector ring 118.

Figure 10:
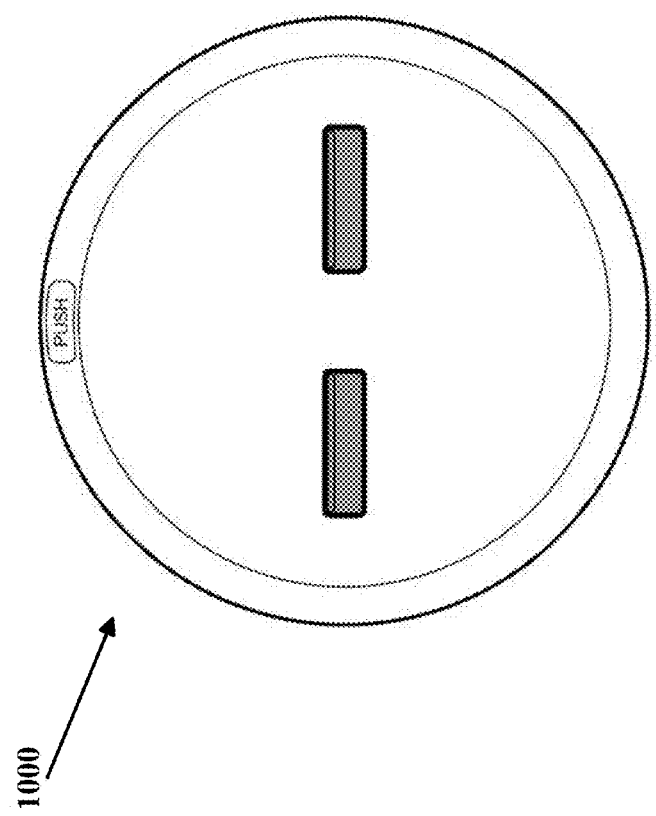
FIG. 10 illustrates an example accessory device.

FIG. 10 illustrates an example accessory in the form of a USB socket 1000, which may be coupled to the plug 102 to engage with the socket 104. The USB socket 1000 may be powered via connector disc 114 and connector ring 118 and send and receive data using powerline communication that occurs via connector disc 114 and connector ring 118.

Figure 11:
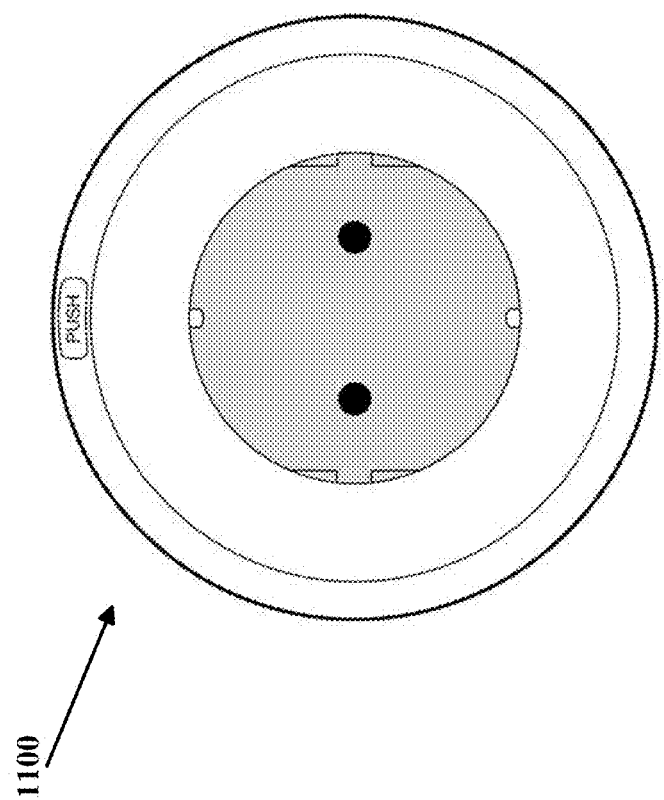
FIG. 11 illustrates an example accessory device.

FIG. 11 illustrates an example accessory in the form of a 220 VAC socket 1100, which may be coupled to the plug 102 to engage with the socket 104. The 220 VAC socket 1100 may be powered via connector disc 114 and connector ring 118.

Figure 12:
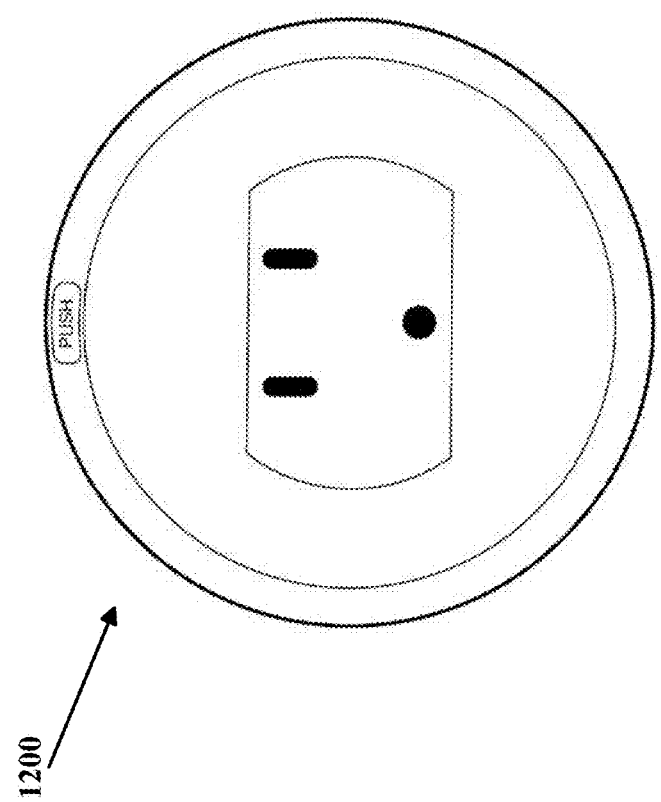
FIG. 12 illustrates an example accessory device.

FIG. 12 illustrates an example accessory in the form of a 110 VAC socket 1200, which may be coupled to the plug 102 to engage with the socket 104. The 110 VAC socket 1200 may be powered via connector disc 114 and connector ring 118.

Figure 13:
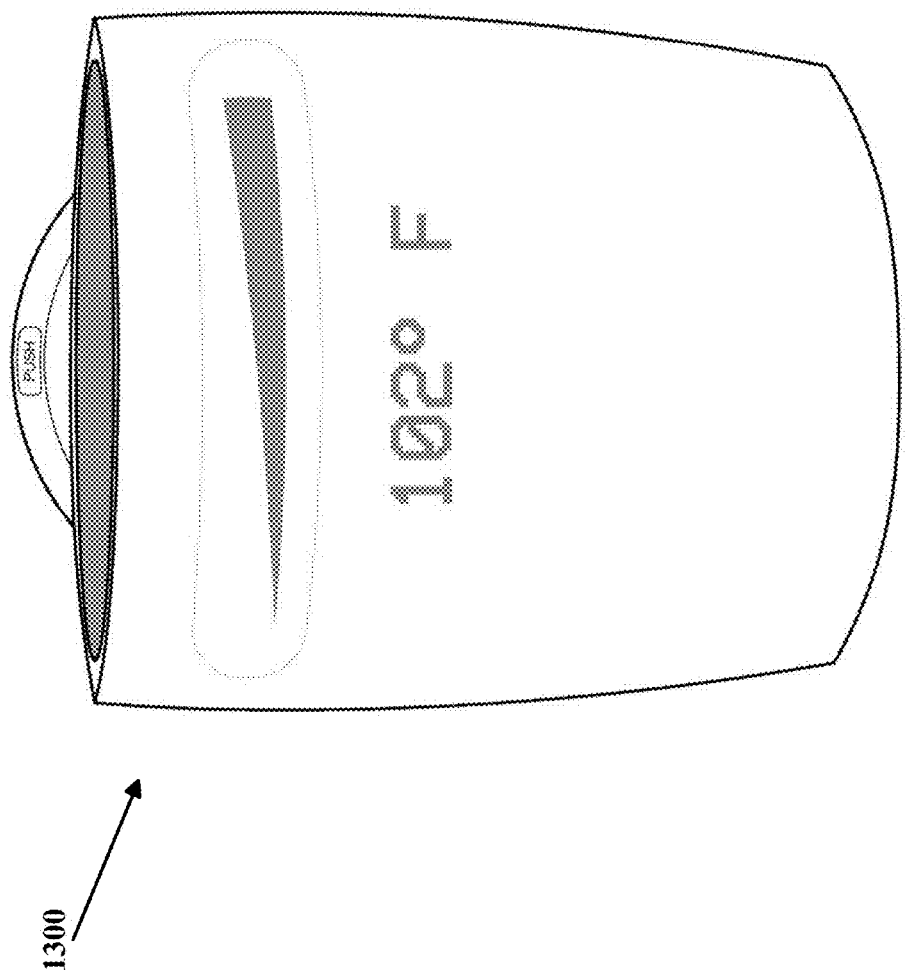
FIG. 13 illustrates an example accessory device.

FIG. 13 illustrates an example accessory in the form of an electrically warming or cooling cupholder 1300, which may be temperature regulated via a thermostat. The cupholder 1300 may be coupled to the plug 102 to engage with the socket 104. The cupholder 1300 may be configured to receive a cup within a cavity disposed within the cupholder 1300. The cupholder 1300 may be powered via connector disc 114 and connector ring 118 and may transmit and receive data wirelessly or by using powerline communication that occurs via connector disc 114 and connector ring 118.

Figure 14:
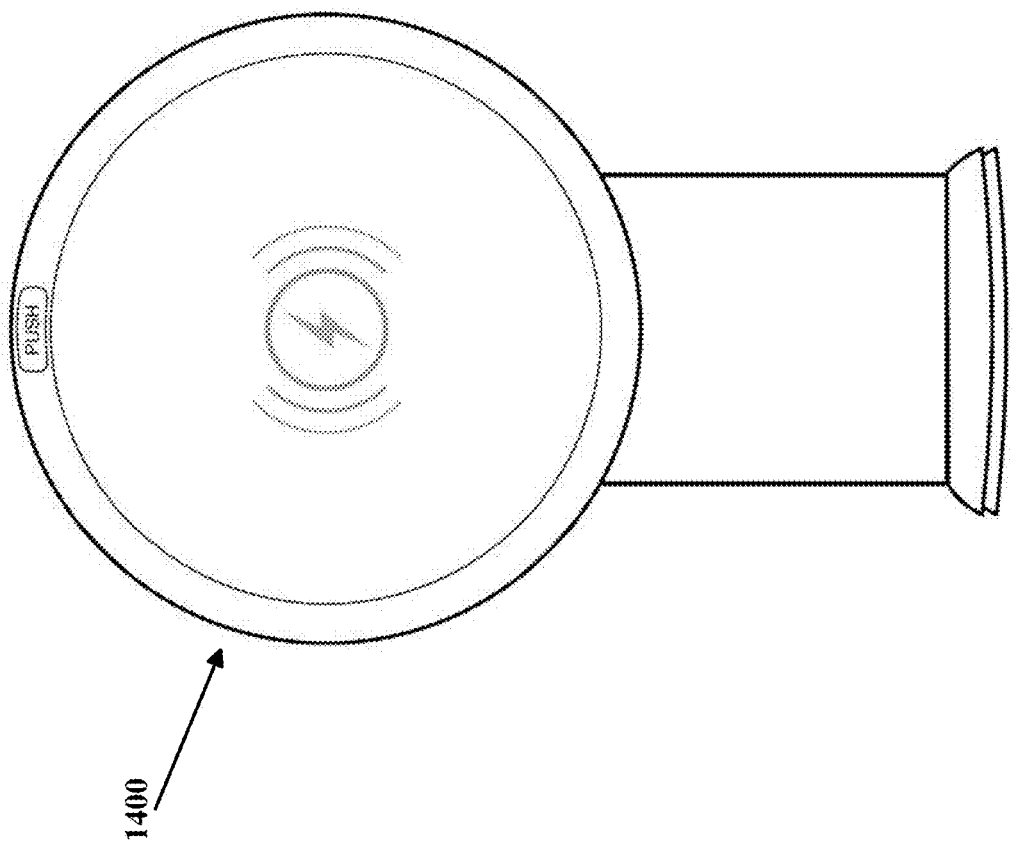
FIG. 14 illustrates an example accessory device.

FIG. 14 illustrates an example accessory in the form of an inductive charger 1400, which may be coupled to the plug 102 to engage with the socket 104. The inductive charger 1400 may be powered via connector disc 114 and connector ring 118 and may transmit and receive data wirelessly or by using powerline communication that occurs via connector disc 114 and connector ring 118.

Figure 15:
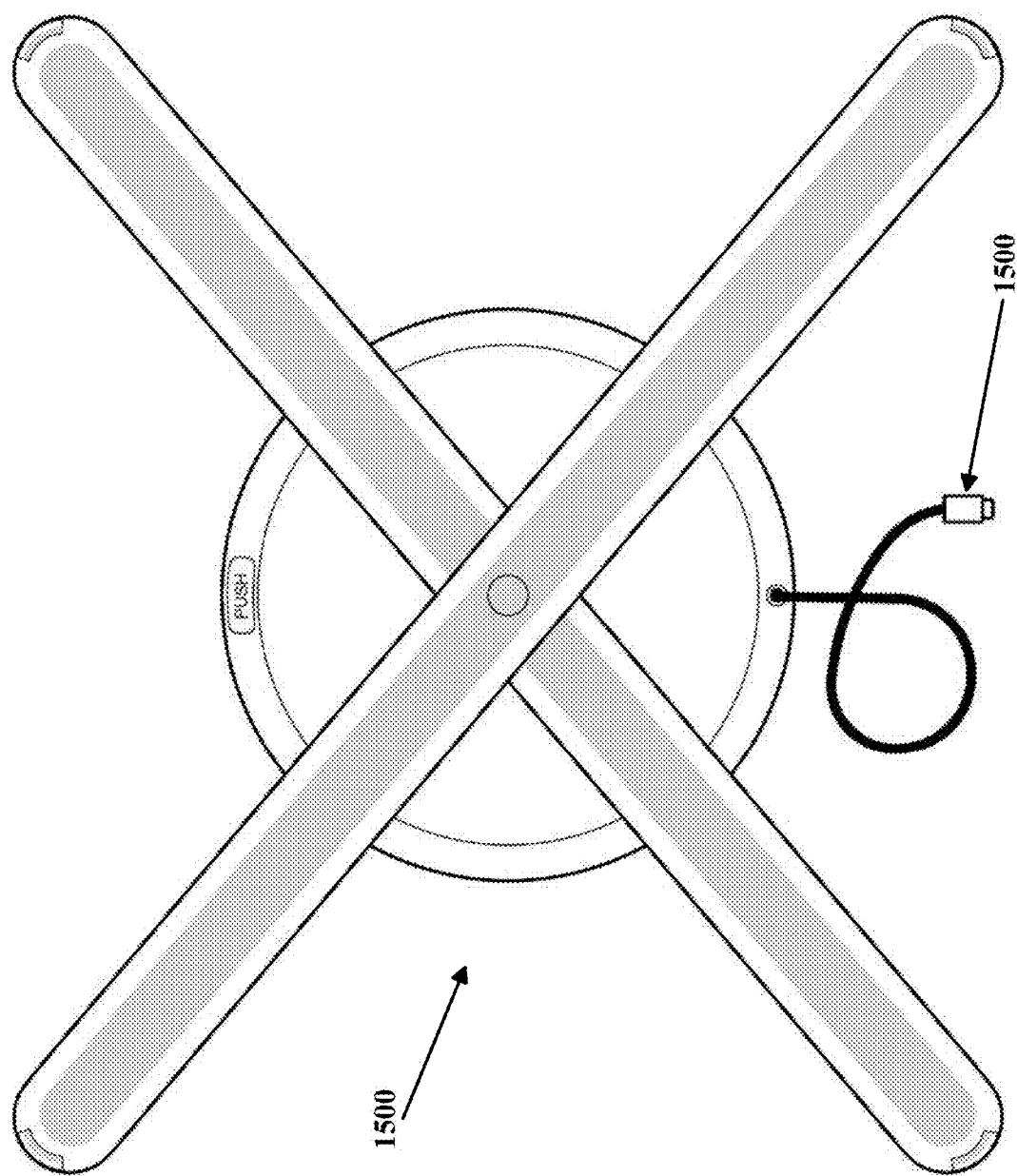
FIG. 15 illustrates an example accessory device.

FIG. 15 illustrates an example accessory in the form of a tablet holder 1500, which may be coupled to the plug 102 to engage with the socket 104. The tablet holder 1500 may be powered via connector disc 114 and connector ring 118 and may transmit and receive data wirelessly or by using powerline communication that occurs via connector disc 114 and connector ring 118. The tablet holder 1500 may additionally provide an electrical connector, such as a mini-USB connector 1502 for example, to provide charging of a tablet or smartphone-type device.

Figure 16:
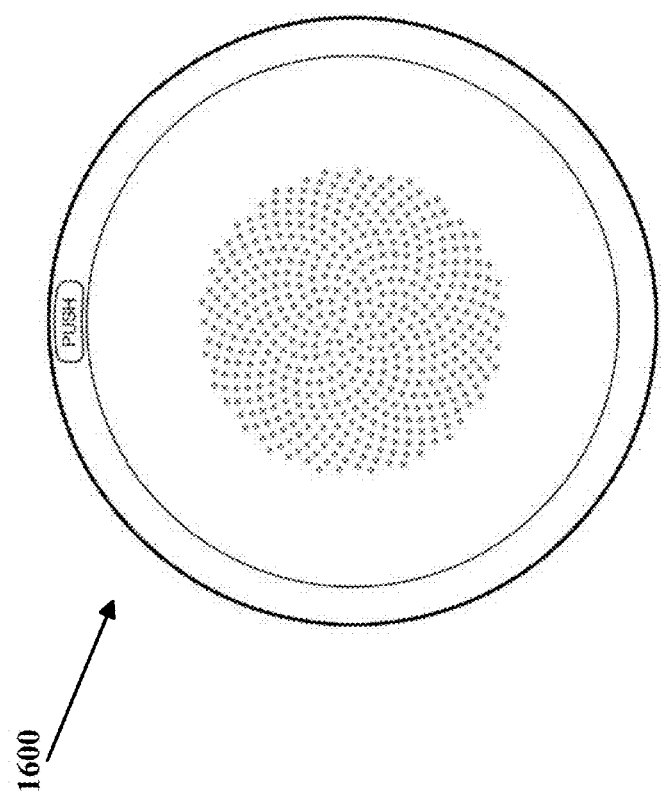
FIG. 16 illustrates an example accessory device.

FIG. 16 illustrates an example accessory in the form of a scent diffuser 1600, which may be coupled to the plug 102 to engage with the socket 104. The scent diffuser 1600 may be powered via connector disc 114 and connector ring 118 and may transmit and receive data wirelessly or by using powerline communication that occurs via connector disc 114 and connector ring 118.

Figure 17:
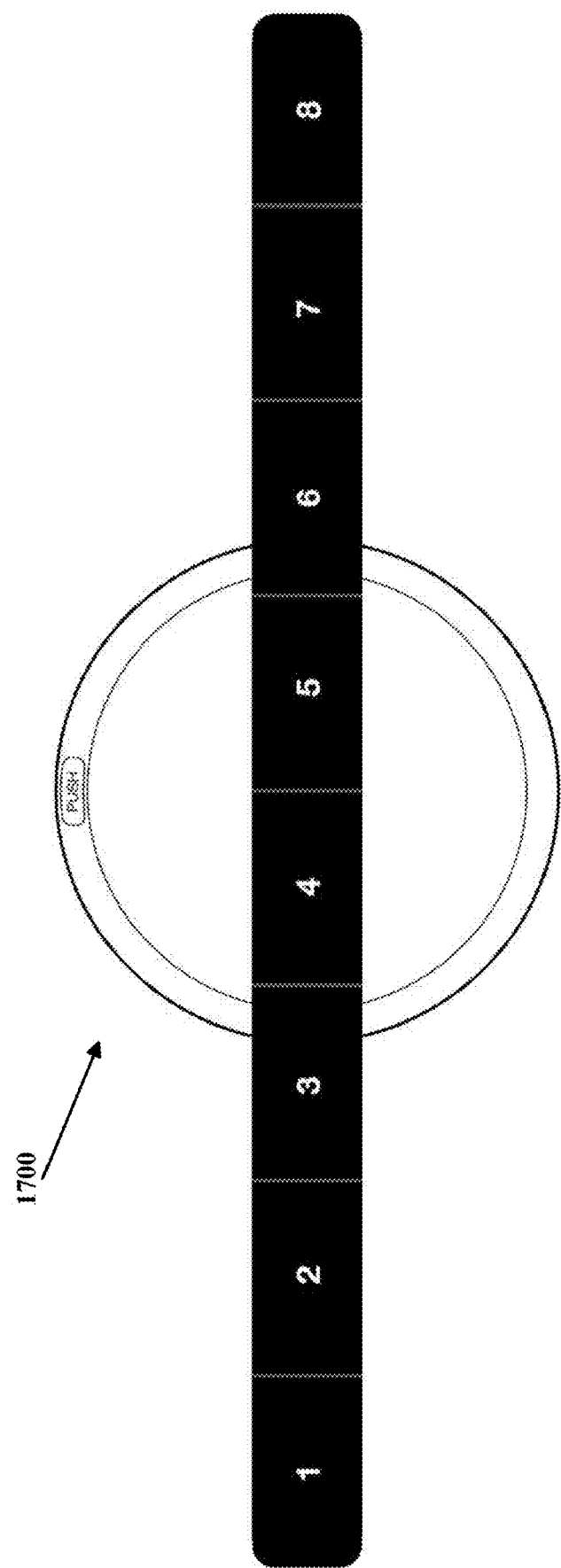
FIG. 17 illustrates an example accessory device.

FIG. 17 illustrates an example accessory in the form of a hardkey keyboard 1700, which may be coupled to the plug 102 to engage with the socket 104. The hardkey keyboard 1700 may be powered via connector disc 114 and connector ring 118 and may transmit and receive data wirelessly or by using powerline communication that occurs via connector disc 114 and connector ring 118.

Figure 18:
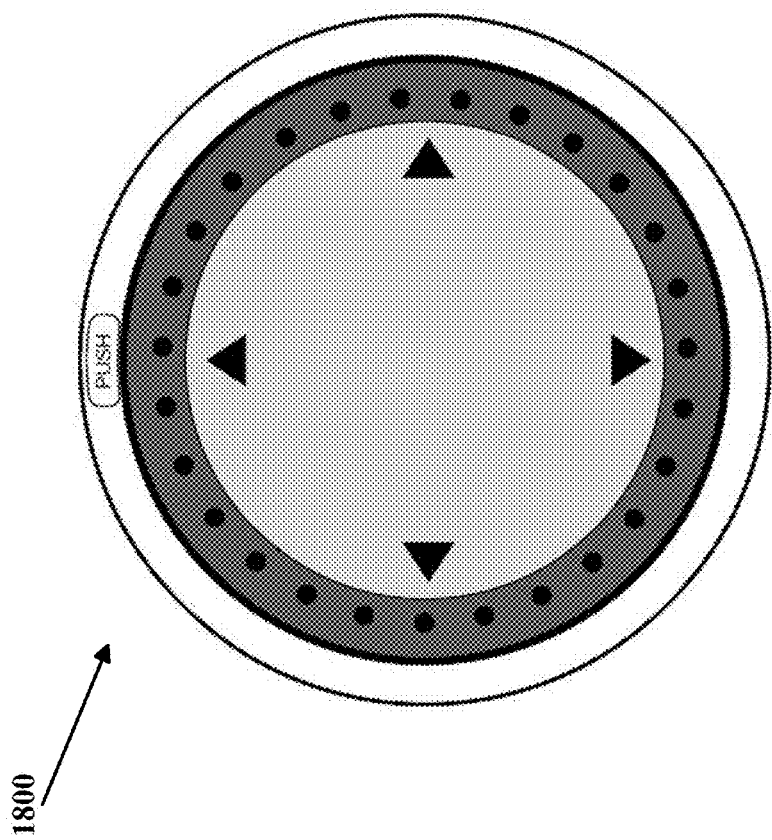
FIG. 18 illustrates an example accessory device.

FIG. 18 illustrates an example accessory in the form of a rotary controller 1800, which may be coupled to the plug 102 to engage with the socket 104. The rotary controller 1800 may be powered via connector disc 114 and connector ring 118 and may transmit and receive data wirelessly or by using powerline communication that occurs via connector disc 114 and connector ring 118.

Figure 19:
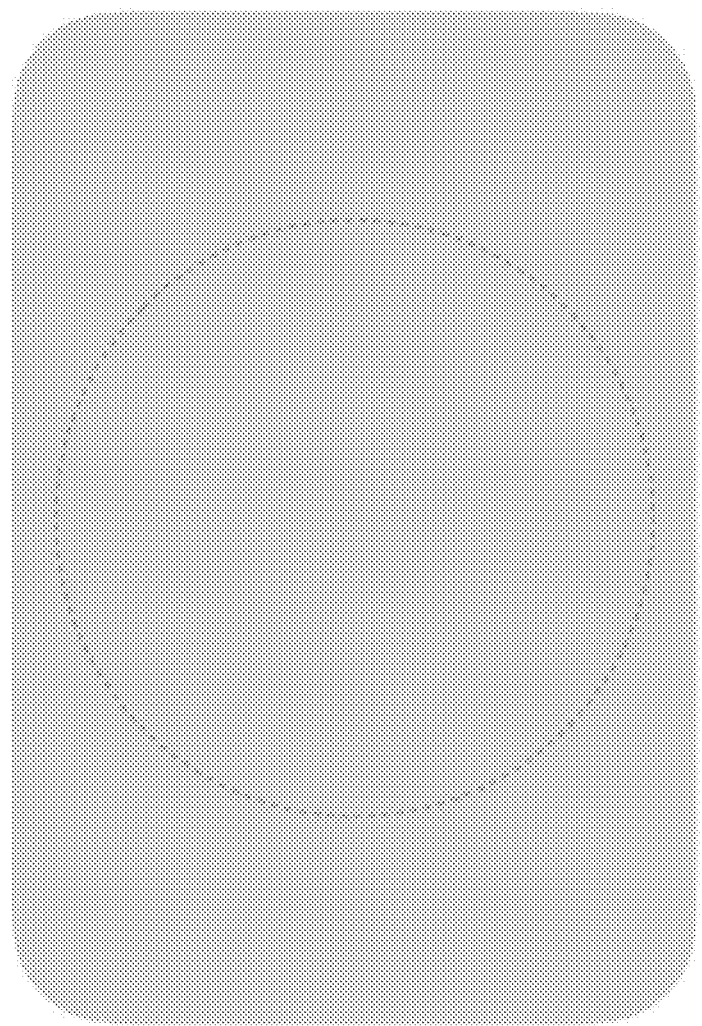
FIG. 19 illustrates an example accessory device.

FIG. 19 illustrates an example accessory in the form of a trackpad 1900, which may be coupled to the plug 102 to engage with the socket 104. The trackpad 1900 may be powered via connector disc 114 and connector ring 118 and may transmit and receive data wirelessly or by using powerline communication that occurs via connector disc 114 and connector ring 118.

Figure 20:
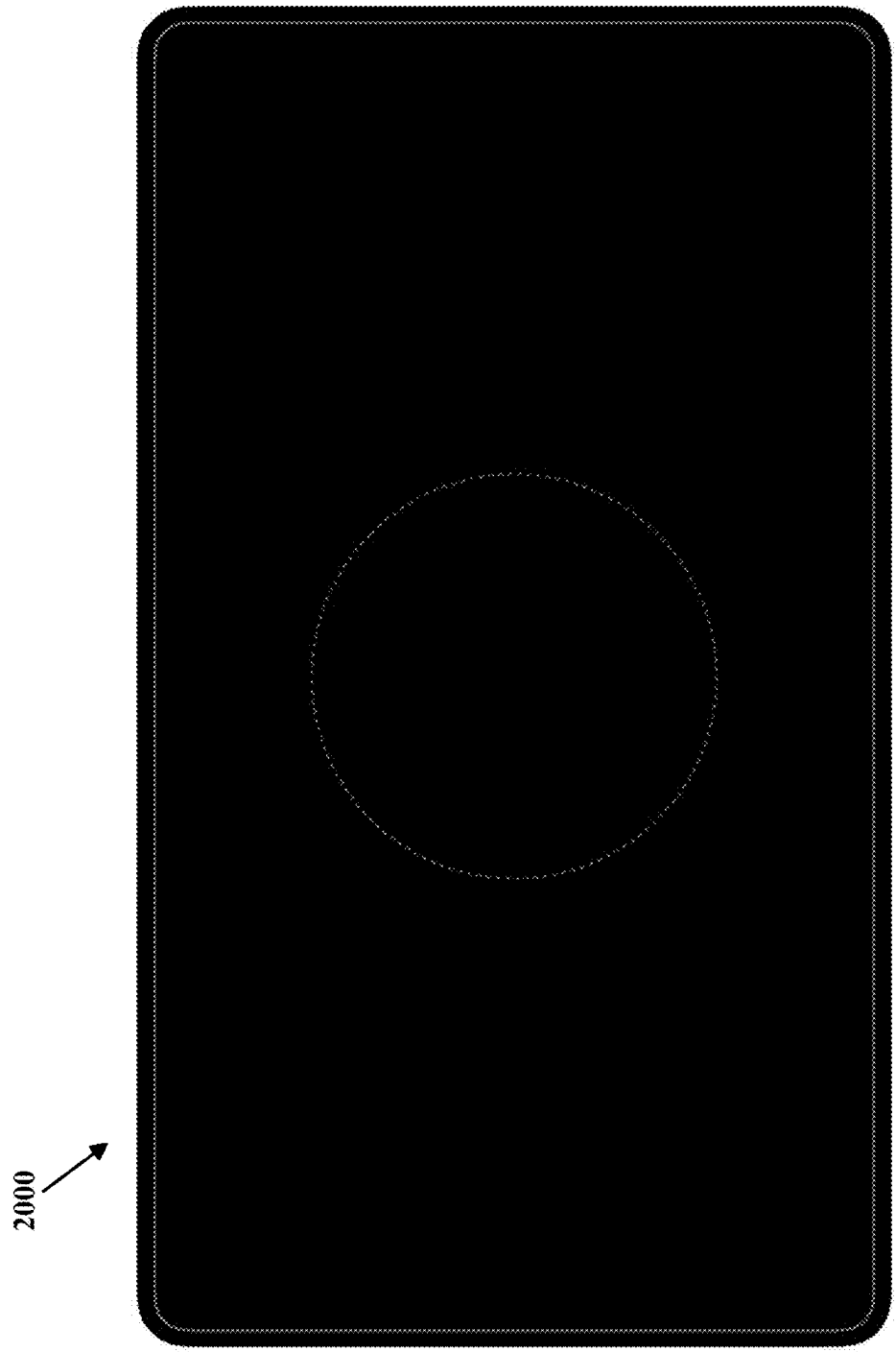
FIG. 20 illustrates an example accessory device.

FIG. 20 illustrates an example accessory in the form of a display 2000, which may be coupled to the plug 102 to engage with the socket 104. The display 2000 may be powered via connector disc 114 and connector ring 118 and may transmit and receive data wirelessly or by using powerline communication that occurs via connector disc 114 and connector ring 118.

Figure 21:
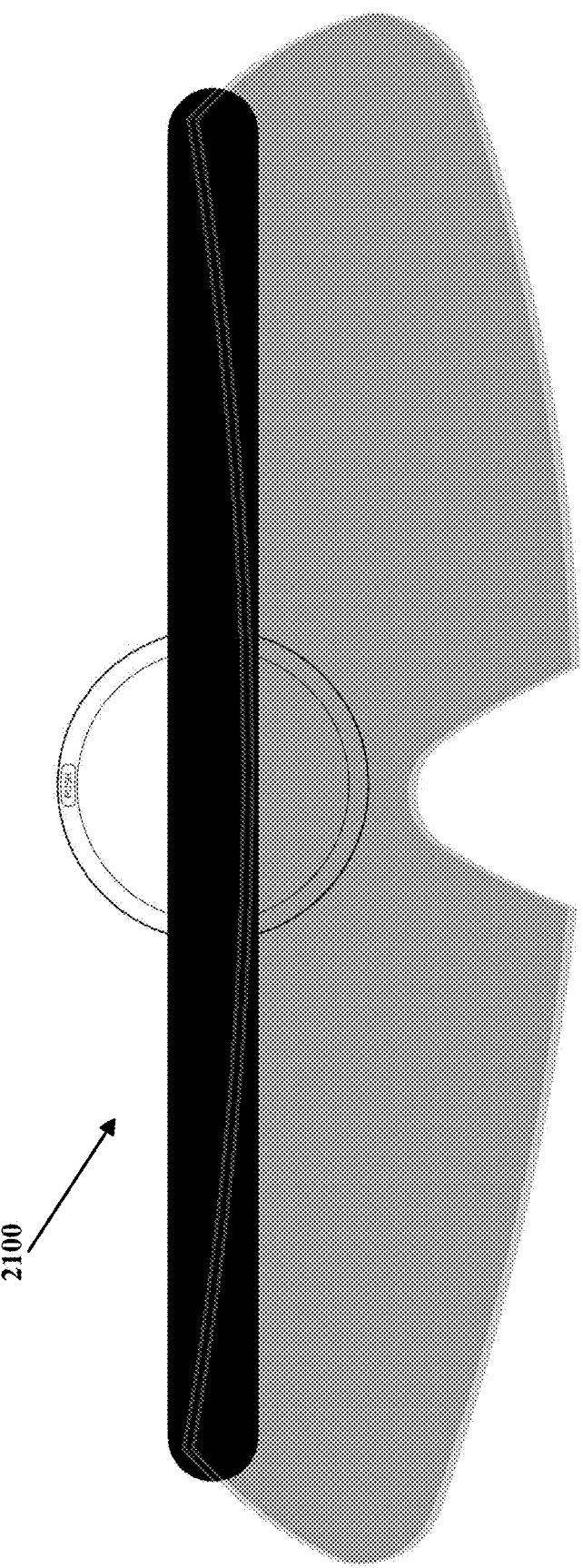
FIG. 21 illustrates an example accessory device.

FIG. 21 illustrates an example accessory in the form of a visor "heads-up" type display 2100, which may be coupled to the plug 102 to engage with the socket 104. The visor display 2100 may be powered via connector disc 114 and connector ring 118 and may transmit and receive data wirelessly or by using powerline communication that occurs via connector disc 114 and connector ring 118. In one example, the visor display 2100 may be configured to be inserted into a socket 104 disposed within a headliner of the vehicle to provide the user with augmented reality functionality.

Figure 22:
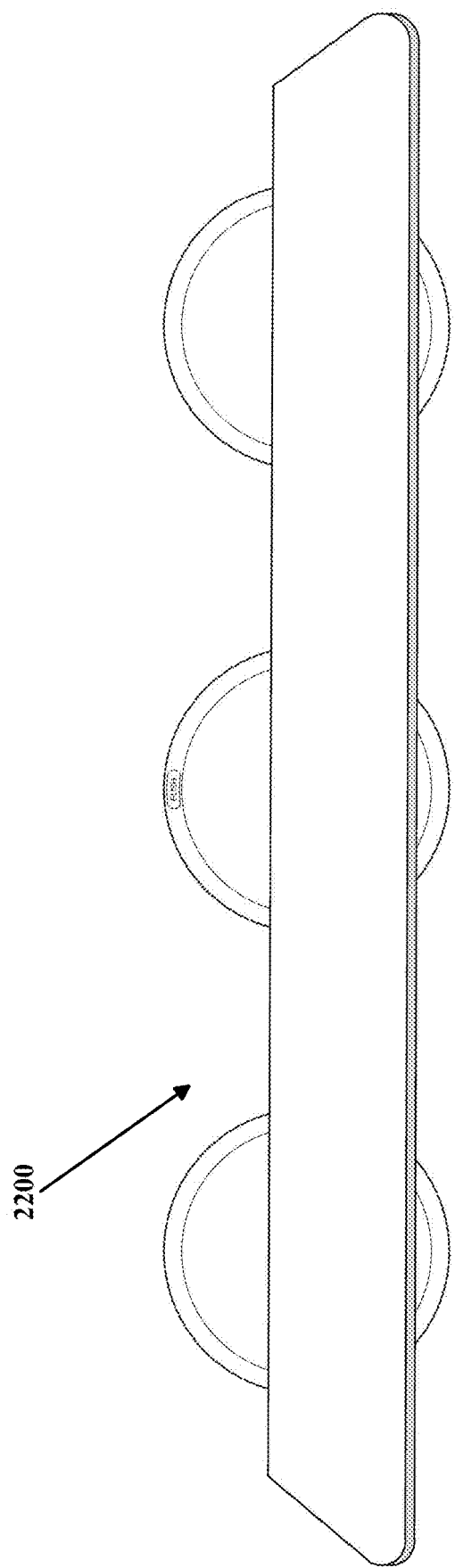
FIG. 22 illustrates an example accessory device.

FIG. 22 illustrates an example mechanical-only accessory in the form of a table 2200, which may be coupled to the plug 102 to engage with the socket 104. The table 2200 may span one or more sockets 104 to provide a stable support surface.

Figure 23:
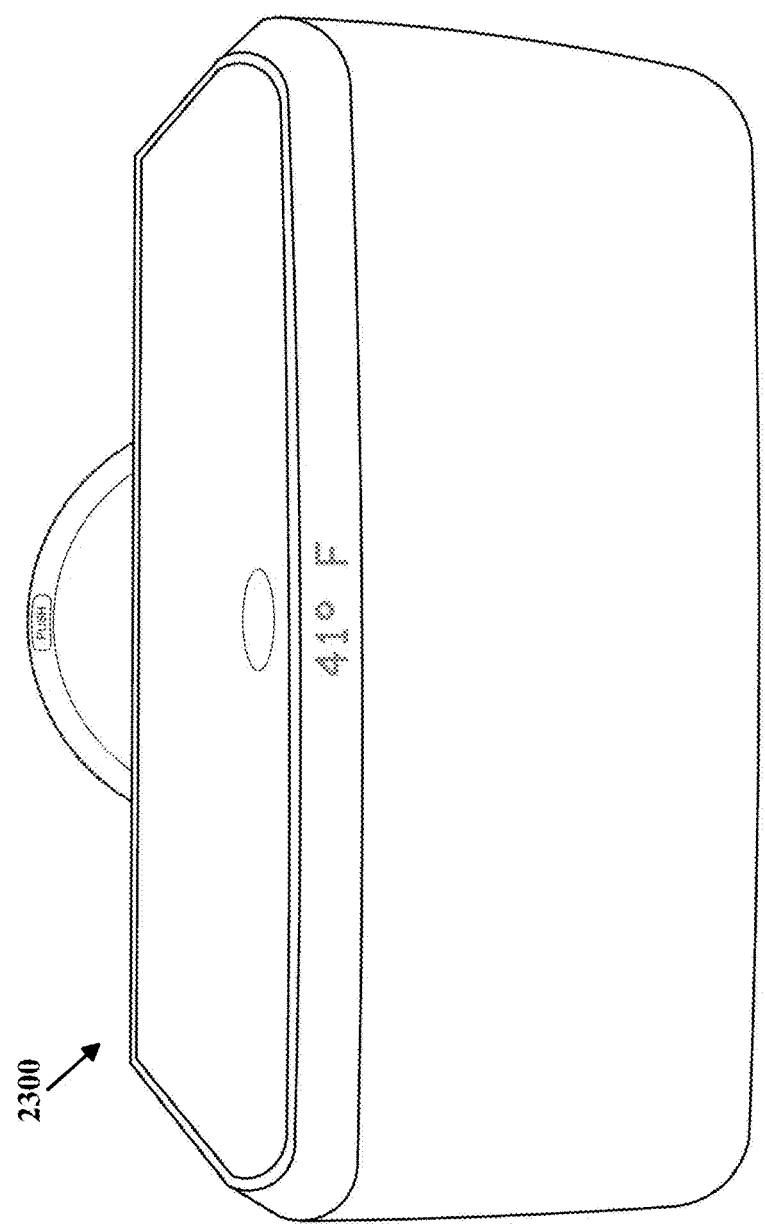
FIG. 23 illustrates an example accessory device.

FIG. 23 illustrates an example accessory in the form of a storage bin 2300, which may be temperature regulated. The storage bin 2300 may be coupled to the plug 102 to engage with the socket 104. The storage bin 2300 may be configured to receive various items within a cavity disposed within the storage bin 2300. The storage bin 2300 may be powered via connector disc 114 and connector ring 118 and may transmit and receive data wirelessly or by using powerline communication that occurs via connector disc 114 and connector ring 118.

Figure 24:
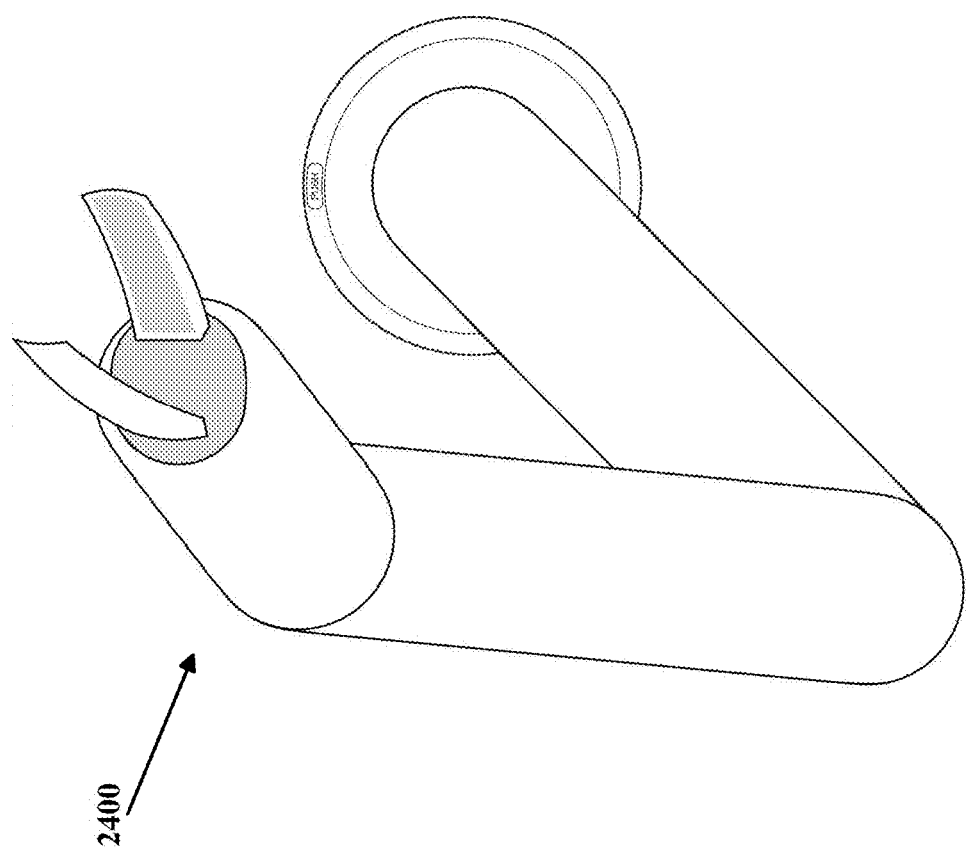
FIG. 24 illustrates an example accessory device.

FIG. 24 illustrates an example accessory in the form of a robotic attachment 2400, which may be coupled to the plug 102 to engage with the socket 104. The robotic attachment 2400 may be powered via connector disc 114 and connector ring 118 and may transmit and receive data wirelessly or by using powerline communication that occurs via connector disc 114 and connector ring 118.

FIG. 25 illustrates a flow diagram of an example of steps 2500 to use the plug 102 and socket 104 in accordance with the present subject matter. The steps may include additional, different, or fewer operations than illustrated in FIG. 25. The steps may be executed in a different order than illustrated in FIG. 25. In step S100 the socket 104 may be provided and concealed by a layer of the flexible fabric 300. The socket 104 may have one or more electrical contacts, which may take the form of connector disc 114 and/or connector ring 118.

In step S101 the plug 102 may be provided. The plug 102 may have one or more electrical contacts, which may take the form of the central spring-loaded connector pin 108 and/or radial spring-loaded connector pin 112. The plug 102 may be configured to engage with the socket 104 based at least on having complementary shapes, such as concave and convex bowl shapes, which may aid in centering the plug 102 within the socket 104.

In step S102, the plug 102 may be advanced toward the socket 104 such that an anterior surface of the plug 102 contacts the layer of the flexible fabric 300. In step S103, the plug 102 may be further advanced toward the socket 104 such that the layer of flexible fabric 300 is deformed by the anterior surface of the plug 102. During this step, the flexible fabric 300 may be deformed such that it conforms to the anterior surface of the plug 102.

In step S104, a latching assembly, including one or more latches 106 of the plug 102 and/or the circumferential groove 122 of the socket 104 may be engaged to retain the plug 102 within the socket 104.

In S105, a conductive path may be created between the one or more electrical contacts of the plug 102 and the one or more electrical contacts of the socket 104 via a conductive pattern 302 formed on the deformed layer of the flexible fabric 300. Because the central connector pin 108 and the radial connector pin 112 are each spring-loaded, the connector pins 108/112 may at least partially retract into the plug 102 upon being seated within the socket 104.

In S106, an electrical accessory that is disposed upon and/or otherwise electrically connected directly with the plug 102 may be powered via a power supply disposed upon and/or otherwise electrically connected directly with the socket 104. The electrical accessory may be one or more of the example accessories discussed with reference to FIGS. 6 through 21, 23, and 24.

The logic illustrated in the flow diagrams may include additional, different, or fewer operations than illustrated. The operations illustrated may be performed in an order different than illustrated.

To clarify the use of and to hereby provide notice to the public, the phrases "at least one of <A>, <B>, . . . and <N>" or "at least one of <A>, <B>, . . . or <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

While various embodiments have been described, it will be apparent to those of ordinary skill in the art that many more embodiments and implementations are possible. Accordingly, the embodiments described herein are examples, not the only possible embodiments and implementations.

The subject-matter of the disclosure may also relate, among others, to the following aspects:

A first aspect relates to a connector assembly that may include a socket configured to receive a plug. The socket may include an electrical contact. The connector assembly may further include a flexible fabric that may be embedded with a pattern of electrically conductive elements spanning the socket to conceal the electrical contact. The flexible fabric may be configured to deform toward the electrical contact of the socket to cause at least a portion of the pattern to contact the electrical contact.

A second aspect relates to the connector assembly of aspect 1, wherein the electrically conductive elements may include a plurality of uniformly spaced dots.

A third aspect relates to the connector assembly of any preceding aspect, wherein the dots may be spaced apart by a distance that increases when the flexible fabric is deformed toward the electrical contact of the socket.

A fourth aspect relates to the connector assembly of any preceding aspect, wherein the dots may be spaced apart by a distance less than a width or diameter of an electrical contact of the plug.

A fifth aspect relates to the connector assembly of any preceding aspect, wherein the electrical contact may be a first electrical contact disposed in a center of the socket, and the connector assembly may further include a second electrical contact spaced apart from the first electrical contact and formed in a ring shape.

A sixth aspect relates to the connector assembly of any preceding aspect, wherein the first electrical contact may be spaced apart from the second electrical contact by a distance greater than or equal to a width or diameter of an electrical contact of the plug.

A seventh aspect relates to the connector assembly of any preceding aspect, wherein the socket and the plug may be formed in complementary bowl shapes.

An eighth aspect relates to the connector assembly of any preceding aspect, wherein a location of the socket may be highlighted on the flexible fabric by a light source or by print disposed on the flexible fabric.

A ninth aspect relates to the connector assembly of any preceding aspect, further comprising a circumferential groove to retain a latch disposed on the plug.

A tenth aspect relates to the connector assembly of any preceding aspect, wherein the electrical contact of the socket may be incapable of delivering power to the plug without deformation of the flexible fabric.

An eleventh aspect relates to the connector assembly of any preceding aspect, wherein the flexible fabric may be configured to resiliently return to a previous shape following deformation toward the electrical contact.

A twelfth aspect relates a method of inserting a plug into a socket including providing the socket having a first electrical contact concealed by a flexible fabric layer, providing the plug having a second electrical contact, advancing the plug toward the socket such that the flexible fabric is deformed by an anterior surface of the plug, creating a conductive path between the first electrical contact, the second electrical contact, and the deformed flexible fabric, and providing power via the conductive path to an electrical accessory.

A thirteenth aspect relates to the method of the twelfth aspect, wherein the flexible fabric may include a uniform pattern of a plurality of conductive elements.

A fourteenth aspect relates to the method of any preceding aspect, wherein the plurality of conductive elements may include a plurality of dots spaced apart by a distance that increases when the flexible fabric is deformed by the anterior surface of the plug.

A fifteenth aspect relates to the method of any preceding aspect, wherein the step of advancing the plug may further include conforming the flexible fabric to a bowl shape of the anterior surface of the plug.

A sixteenth aspect relates to the method of any preceding aspect, further comprising highlighting a location of the socket using a light source that projects onto the flexible fabric.

A seventeenth aspect relates to the method of any preceding aspect, wherein the first electrical contact may be ring-shaped, the second electrical contact may not be ring-shaped, and creating the conductive path may further include applying the first electrical contact to the second electrical contact.

An eighteenth aspect relates to the method of any preceding aspect, wherein creating the conductive path may further include at least partially retracting the second electrical contact to within the plug.

A nineteenth aspect relates to the method of any preceding aspect, further comprising retaining the plug within the socket using both a latch and a magnet.

A twentieth aspect relates to the method of any preceding aspect, wherein providing the plug may further include sizing a width or a diameter of the electrical contact larger than a distance separating plurality of conductive elements of the uniform pattern.

In addition to the features mentioned in each of the independent aspects enumerated above, some examples may show, alone or in combination, the optional features mentioned in the dependent aspects and/or as disclosed in the description above and shown in the figures.

What is claimed is:

1. A connector assembly comprising:
   a socket configured to receive a plug, the socket comprising an electrical contact; and
   a flexible fabric embedded with a pattern of electrically conductive elements and spanning the socket to conceal the electrical contact, wherein
   the flexible fabric is configured to deform toward the electrical contact of the socket to cause at least a portion of the pattern to contact the electrical contact.

2. The connector assembly of claim 1, wherein
the electrically conductive elements comprise a plurality of uniformly spaced dots.

3. The connector assembly of claim 2, wherein
the dots are spaced apart by a distance that increases when the flexible fabric is deformed toward the electrical contact of the socket.

4. The connector assembly of claim 2, wherein
the dots are spaced apart by a distance less than a width or diameter of an electrical contact of the plug.

5. The connector assembly of claim 1, wherein
the electrical contact is a first electrical contact disposed in a center of the socket, and the connector assembly further comprises:
   a second electrical contact spaced apart from the first electrical contact and formed in a ring shape.

6. The connector assembly of claim 5, wherein
the first electrical contact is spaced apart from the second electrical contact by a distance greater than or equal to a width or diameter of an electrical contact of the plug.

7. The connector assembly of claim 1, wherein
the socket and the plug are formed in complementary bowl shapes.

8. The connector assembly of claim 1, wherein
a location of the socket is highlighted on the flexible fabric by a light source or by print disposed on the flexible fabric.

9. The connector assembly of claim 1, further comprising:
a circumferential groove to retain a latch disposed on the plug.

10. The connector assembly of claim 1, wherein
the electrical contact of the socket is incapable of delivering power to the plug without deformation of the flexible fabric.

11. The connector assembly of claim 1, wherein
the flexible fabric is configured to resiliently return to a previous shape following deformation toward the electrical contact.

12. A method of inserting a plug into a socket comprising:
providing the socket having a first electrical contact concealed by a flexible fabric layer;
providing the plug having a second electrical contact;
advancing the plug toward the socket such that the flexible fabric is deformed by an anterior surface of the plug;
creating a conductive path between the first electrical contact, the second electrical contact, and the deformed flexible fabric; and
providing power via the conductive path to an electrical accessory.

13. The method of claim 12, wherein
the flexible fabric comprises a uniform pattern of a plurality of conductive elements.

14. The method of claim 13, wherein
the plurality of conductive elements comprise a plurality of dots spaced apart by a distance that increases when the flexible fabric is deformed by the anterior surface of the plug.

15. The method of claim 12, wherein the step of advancing the plug further comprises:
conforming the flexible fabric to a bowl shape of the anterior surface of the plug.

16. The method of claim 12, further comprising:
highlighting a location of the socket using a light source that projects onto the flexible fabric.

17. The method of claim 12, wherein
the first electrical contact is ring-shaped,
the second electrical contact is not ring-shaped, and creating the conductive path further comprises:
applying the first electrical contact to the second electrical contact.

18. The method of claim 12, wherein creating the conductive path further comprises:
at least partially retracting the second electrical contact to within the plug.

19. The method of claim 12 further comprising:
retaining the plug within the socket using both a latch and a magnet.

20. The method of claim 13, wherein providing the plug further comprises:
sizing a width or a diameter of the electrical contact larger than a distance separating plurality of conductive elements of the uniform pattern.

* * * * *